(12) United States Patent
Koide

(10) Patent No.: US 11,036,100 B2
(45) Date of Patent: Jun. 15, 2021

(54) DISPLAY DEVICE

(71) Applicant: Japan Display Inc., Tokyo (JP)

(72) Inventor: Gen Koide, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/181,380

(22) Filed: Nov. 6, 2018

(65) Prior Publication Data
US 2019/0137808 A1    May 9, 2019

(30) Foreign Application Priority Data

Nov. 6, 2017  (JP) .............................. JP2017-213985

(51) Int. Cl.
| | |
|---|---|
| G02F 1/1345 | (2006.01) |
| G02F 1/1362 | (2006.01) |
| H01L 23/544 | (2006.01) |
| H01L 27/12 | (2006.01) |
| G09G 3/20 | (2006.01) |
| H01L 29/786 | (2006.01) |
| G02F 1/1368 | (2006.01) |
| G09G 3/36 | (2006.01) |

(52) U.S. Cl.
CPC ...... *G02F 1/13458* (2013.01); *G02F 1/13452* (2013.01); *G02F 1/136209* (2013.01); *G09G 3/20* (2013.01); *H01L 23/544* (2013.01); *H01L 27/124* (2013.01); *H01L 29/78633* (2013.01); *G02F 1/1368* (2013.01); *G09G 3/3677* (2013.01); *G09G 2300/0413* (2013.01); *G09G 2300/0426* (2013.01); *H01L 2223/54433* (2013.01)

(58) Field of Classification Search
CPC .................................................. G02F 1/13452
See application file for complete search history.

(56) References Cited

U.S. PATENT DOCUMENTS

| 10,037,984 B2* | 7/2018 | Oh ..................... G02F 1/13452 |
| 10,288,959 B2* | 5/2019 | Miyamoto ........ G02F 1/133345 |
| 2013/0194532 A1 | 8/2013 | Morita |
| 2015/0194109 A1* | 7/2015 | Fujikawa .............. G02F 1/1309 345/100 |

FOREIGN PATENT DOCUMENTS

JP    2013-152409 A    8/2013

* cited by examiner

*Primary Examiner* — Daniel Luke
(74) *Attorney, Agent, or Firm* — Xsensus LLP

(57) ABSTRACT

According to one embodiment, a display device includes an insulating substrate, a first insulating film, terminal portions and a pattern. The first insulating film covers the insulating substrate. The terminal portions are disposed on the first insulating film. The pattern is between the insulating substrate and the first insulating film. The pattern is formed by a semiconductor or a light-shielding material, and the pattern is covered with the first insulating film. The pattern is located just under a first terminal and a second terminal of the terminal portions.

14 Claims, 12 Drawing Sheets

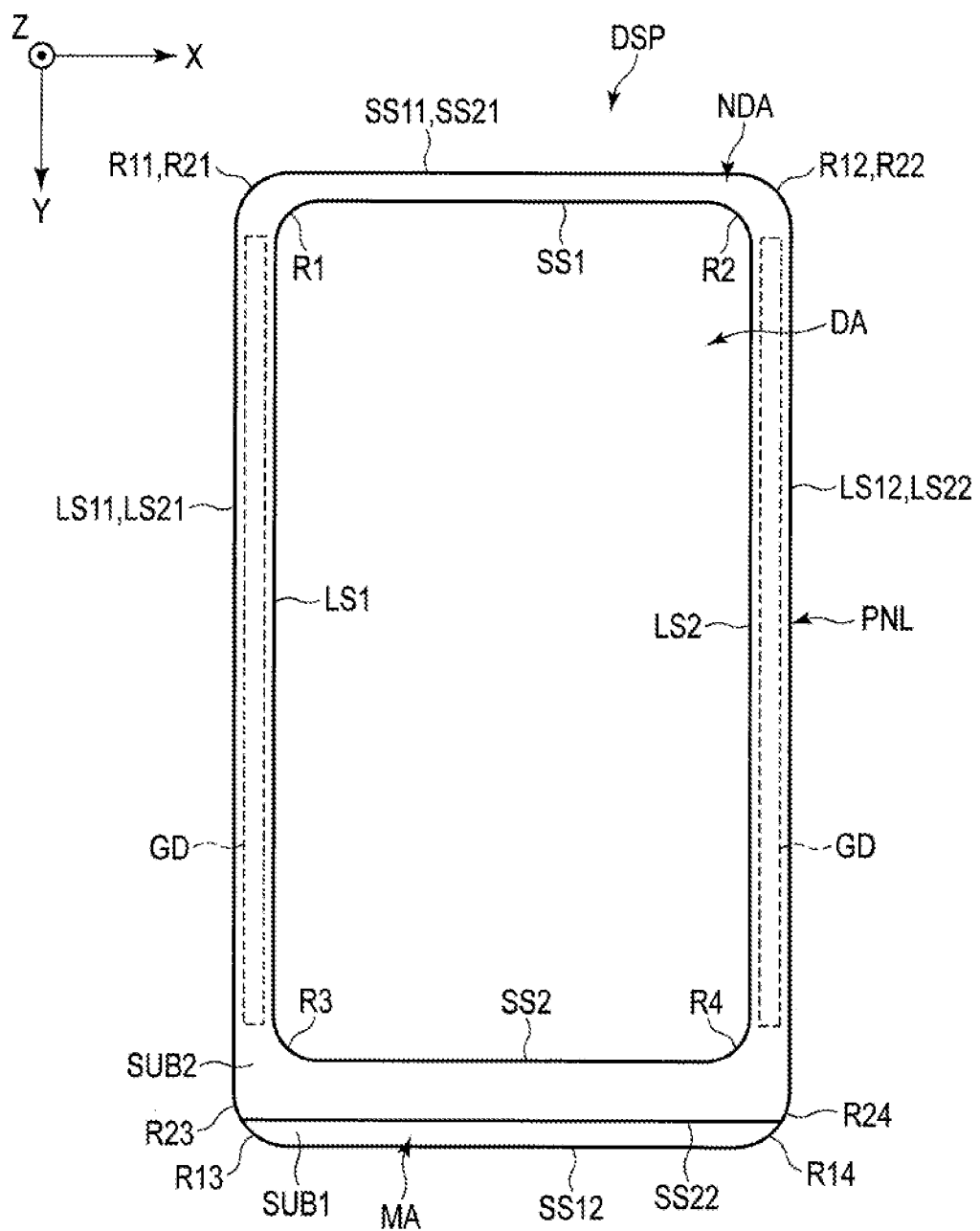
F I G. 1

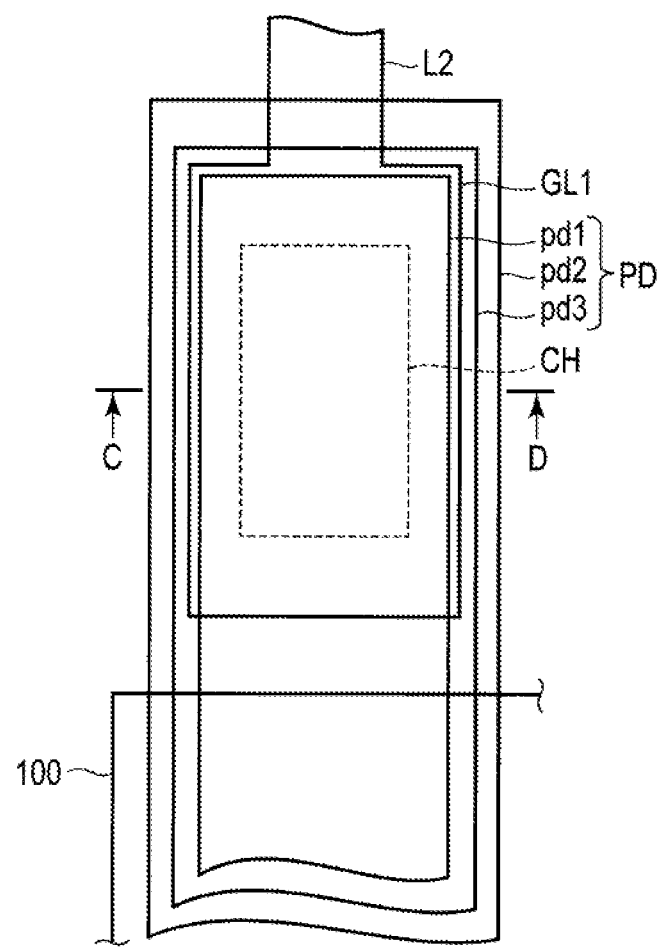
F I G. 8
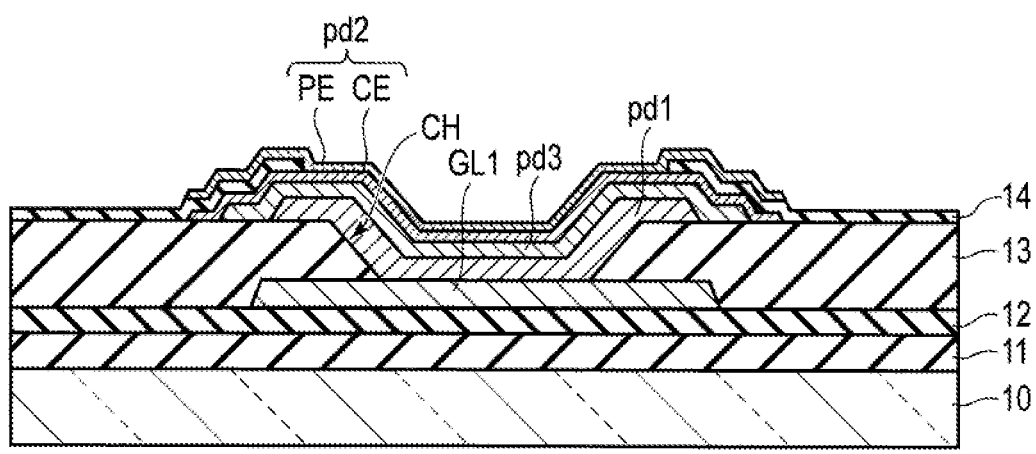
F I G. 9

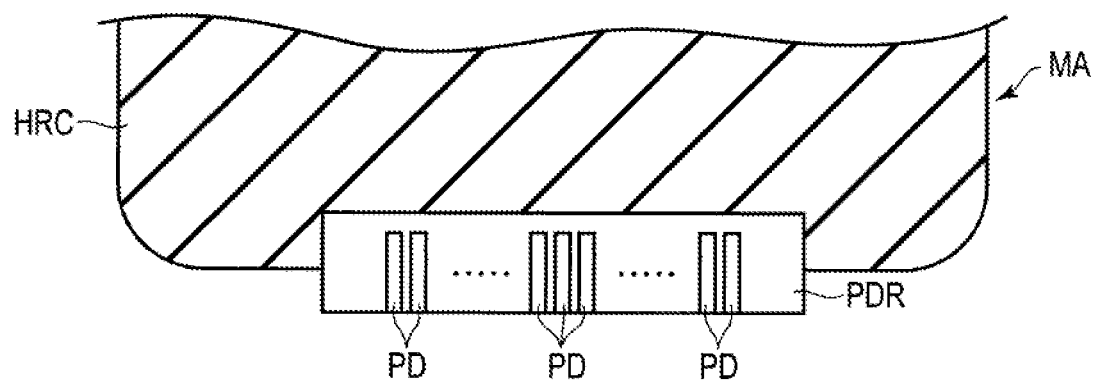
F I G. 10

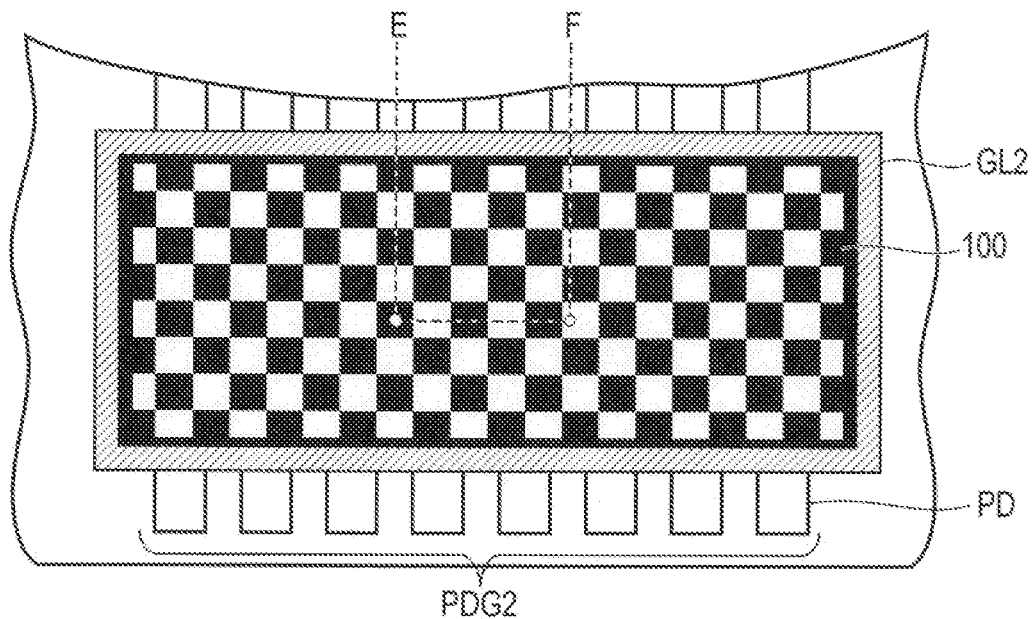
F I G. 11
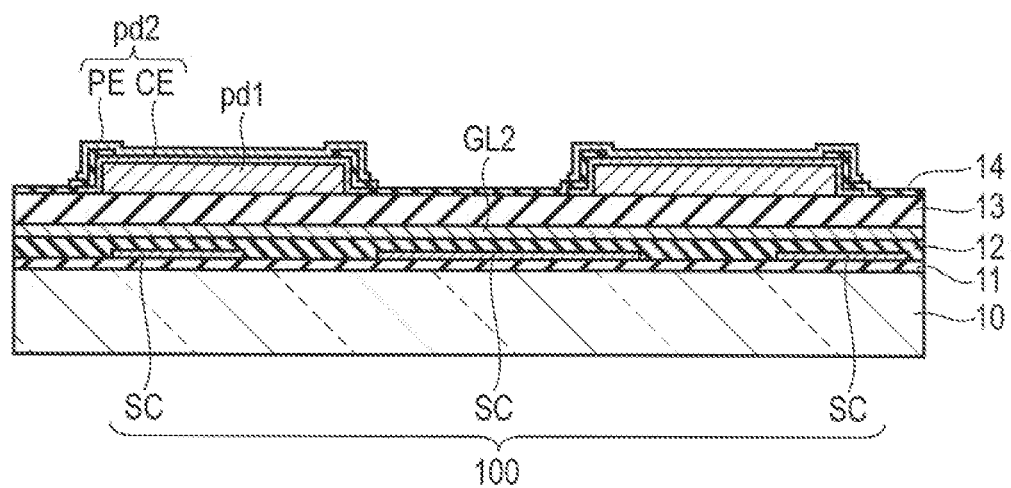
F I G. 12

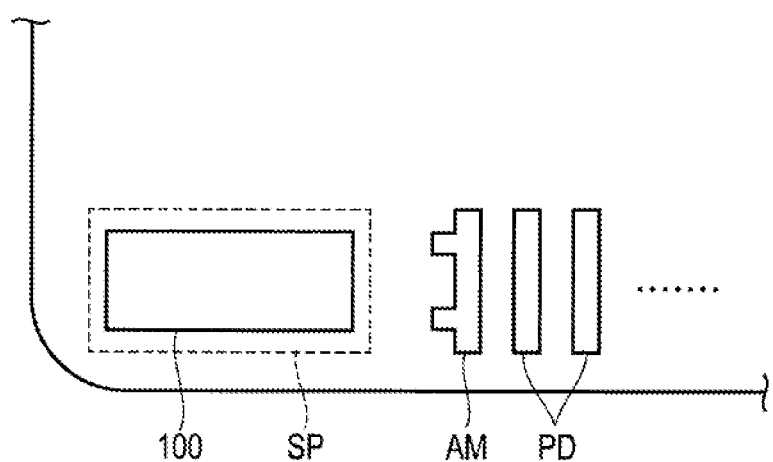
F I G. 13

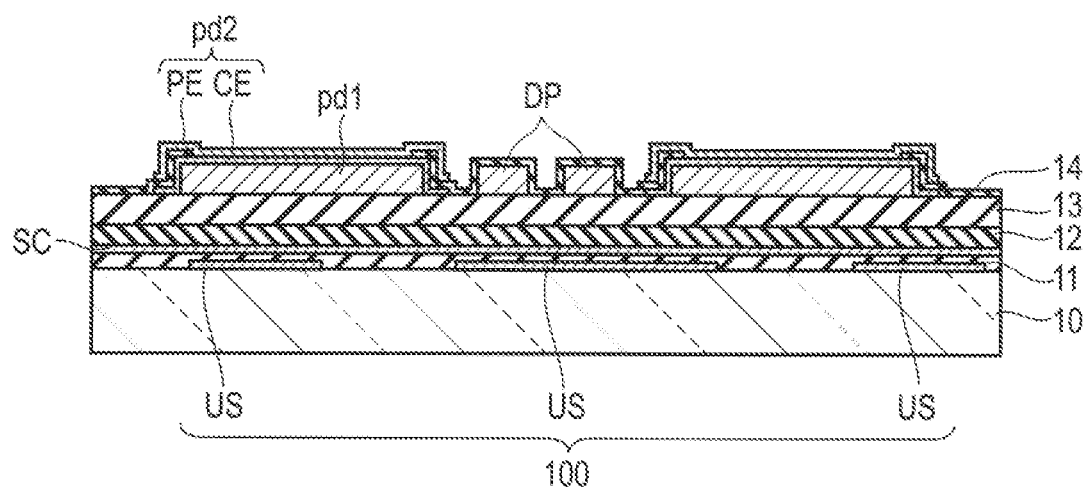
F I G. 16

DISPLAY DEVICE

CROSS-REFERENCE TO RELATED APPLICATIONS

This application is based upon and claims the benefit of priority from Japanese Patent Application No. 2017-213935, filed Nov. 6, 2017, the entire contents of which are incorporated herein by reference.

FIELD

Embodiments described herein relate generally to a display device.

BACKGROUND

Recently, a display device comprising a large display area to display images and video tends to be desired. In general, if the display device becomes large the display area is also larger but, if the display area is made large without changing the size of the display device, a frame (non-display area) disposed in the surrounding of the display area needs to be narrowed. That is, a demand for narrowing the frame of the display device has been increased.

BRIEF DESCRIPTION OF THE DRAWINGS

FIG. 1 is a plan view showing an appearance of a display device according to one of embodiments.

FIG. 8 is an enlarged view showing one of pads in a second pad group.

FIG. 9 is a cross-sectional view showing a structure of the pad shown in FIG. 8 cut along line C-D.

FIG. 10 is a view showing a region where an organic planarizing film is formed.

FIG. 11 is an enlarged view showing a vicinity of a panel ID.

FIG. 12 is a cross-sectional view showing a structure of the panel ID shown in FIG. 11 cut along line E-F.

FIG. 13 is a view showing a general arrangement example of the panel ID.

FIG. 16 is a cross-sectional view showing a structure in a case where the panel ID is formed of a lower light-shielding layer.

DETAILED DESCRIPTION

Figure 2:
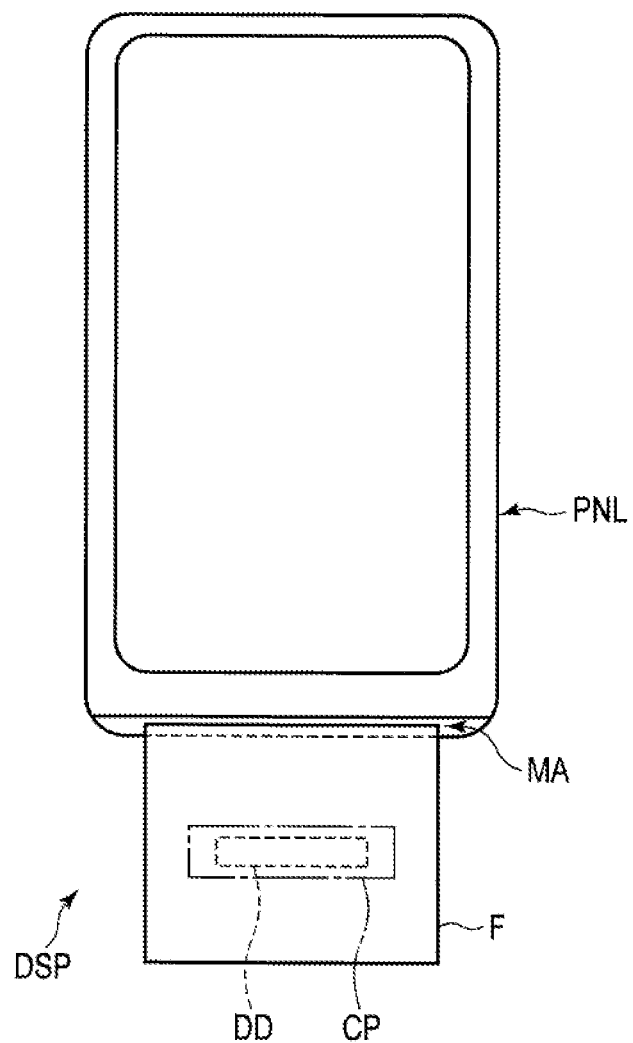
FIG. 2 is a plan view showing a configuration example of mounting a signal source on a display panel shown in FIG. 1.

In general, according to one embodiment, a display device comprises an insulating substrate, a first insulating film, terminal portions and a pattern. The first insulating film covers the insulating substrate. The terminal portions are disposed on the first insulating film. The pattern is between the insulating substrate and the first insulating film. The pattern is formed by a semiconductor or a light-shielding material, and the pattern is covered with the first insulating film. The pattern is located just under a first terminal and a second terminal of the terminal portions.

According to one embodiment, a display device comprises a scanning line, a first terminal, a second terminal, a first lead and a second lead. The scanning line extends in a first direction in a display area. The first terminal is disposed in a non-display area. The second terminal is disposed in the non-display area and adjacent to the first terminal in the first direction. The first lead is drawn from the first terminal. The second lead is drawn from the second terminal. The second lead overlaps the first terminal.

According to one embodiment, a display device comprises a terminal group and a panel ID. The terminal group is disposed in a non-display area. The panel ID is disposed in the non-display area. The panel ID overlaps at least a part, of the terminal group.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a plan view showing an appearance of a display device DSP according to the embodiments. The figure shows a plan view of the display device DSP in an X-Y plane defined by a first direction X and a second direction Y which intersect, each other. In the figure, a third direction Z is a direction which intersects the first direction X and the second direction Y. For example, the first direction X, the second direction Y, and the third direction Z are orthogonal to one another but may intersect one another at an angle other than 90 degrees. In the present specification, a direction toward a pointing end of an arrow indicating the third direction S is referred to as upward (or merely above), and a direction toward the opposite side from the pointing end of the arrow is referred to as downward (or merely below). In addition, an observation position for observing the display panel DSP is assumed to exist on the side of the pointing end of the arrow indicating the third direction Z, and watching the X-Y plane from the observation position is called planar view.

In the embodiments, a liquid crystal display device is explained as an example of the display device. The major configuration explained in the present embodiment can also be applied to a self-luminous display device comprising an organic electroluminescent display element, and the like, an electronic paper display device comprising a cataphoretic element, and the like, a display device employing microelectromechanical systems (MEMS), or a display device employing electrochromism.

The display device DSP comprises a display panel PNL and the like. The display panel PNL is, for example, a liquid crystal display panel and comprises a first substrate SUB1, a second substrate SUB2, and a liquid crystal layer (a liquid crystal layer LC to be explained later). The second substrate SUB2 is opposed to the first substrate SUB1. The display panel PNL includes a display area DA on which an image is displayed and a frame-shaped non-display area NDA surrounding the display area DA. The non-display area NDA includes a mounting area MA where a signal source for an IC chip, a flexible printed circuit and the like is mounted.

When attention is paid to the appearance of the display panel PNL, the first substrate SUB1 includes a pair of shorter sides SS11 and SS12 extending in the first direction X, a pair of longer sides LS11 and LS12 extending in the second direction Y, and four round portions R11 to R14. The second substrate SUB2 includes a shorter side SS21 overlapping the shorter side SS11, longer sides LS21 and LS22 overlapping the longer sides LS11 and LS12, respectively, round portions R21 and R22 overlapping the round portions R11 and R12, respectively, round portions R23 and R24, and a shorter side SS22. The shorter side SS22 does not overlap the shorter side SS12. More specifically, the round portion R23 connects the shorter side SS22 with the longer side LS21, the round portion R24 connects the shorter side SS22 with the longer side LS22, the round portion R23 is curved to partially overlap the round portion R13, and the round portion R24 is curved to partially overlap the round portion R14. The mounting area MA is located between the shorter sides SS12 and SS22 on the first substrate SUB1.

The display area DA includes a pair of shorter sides SS1 and SS2 extending in the first direction X, a pair of longer sides LS1 and LS2 extending in the second direction Y, and four round portions R1 to R4. The shorter sides SS1 and SS2, and the longer sides LS1 and LS2 correspond to linear portions which connect the adjacent round portions. More specifically, radii of curvature which define the round portions R indicating a boundary of the display area DA and the round portions R of the first substrate SUB1 and the second substrate SUB2 may match at the corresponding round portions R or may be different.

In addition, a width of the mounting area MA, i.e., a gap between the shorter sides SS12 and SS22 in the second direction Y is smaller than or substantially the same as a longer-side width of the non-display area NDA, i.e., a gap between the longer sides LS1 and LS11 in the first direction X (or a gap between the longer sides LS2 and LS12). In addition, a shorter side width of the non-display area NDA or a gap between the shorter sides SS1 and SS11 in the second direction Y is equivalent to a longer side width of the non-display area NDA.

The display panel PNL of the embodiments may be a transmissive display panel having a transmissive display function of displaying an image by allowing the light from a back surface side of the first substrate SUB1 to be selectively transmitted. The display panel PNL of the embodiments may be a reflective display panel having a reflective display function of displaying an image by allowing the light from a front surface side of the second substrate SUB2 side to be reflected selectively. The display panel PNL of the embodiments may be a transflective display panel having both the transmissive display function and the reflective display function.

FIG. 2 is a plan view showing a configuration example of mounting a signal source on a display panel PNL shown in FIG. 1.

In the example illustrated, the display device DSP comprises a flexible printed circuit F mounted in a mounting area MA of the display panel PNL, and an IC chip CP mounted on the flexible printed circuit F. The IC chip CP incorporates, for example, a display driver DD which outputs a signal necessary for the image display. In the figure, the IC chip CP is represented by a one-dot-chained line, and the display driver DD is represented by a dot line and has what is called a Chip on Film (COF) structure. The display driver DD comprises at least several parts of a signal line drive circuit SD, a scanning line drive circuit GD, and a common electrode drive circuit CD, which will be explained later. The IC chip CP is not limited to the example illustrated, but may have what is called a Chip on Glass (COG) structure of being mounted in the mounting area MA.

Figure 3:
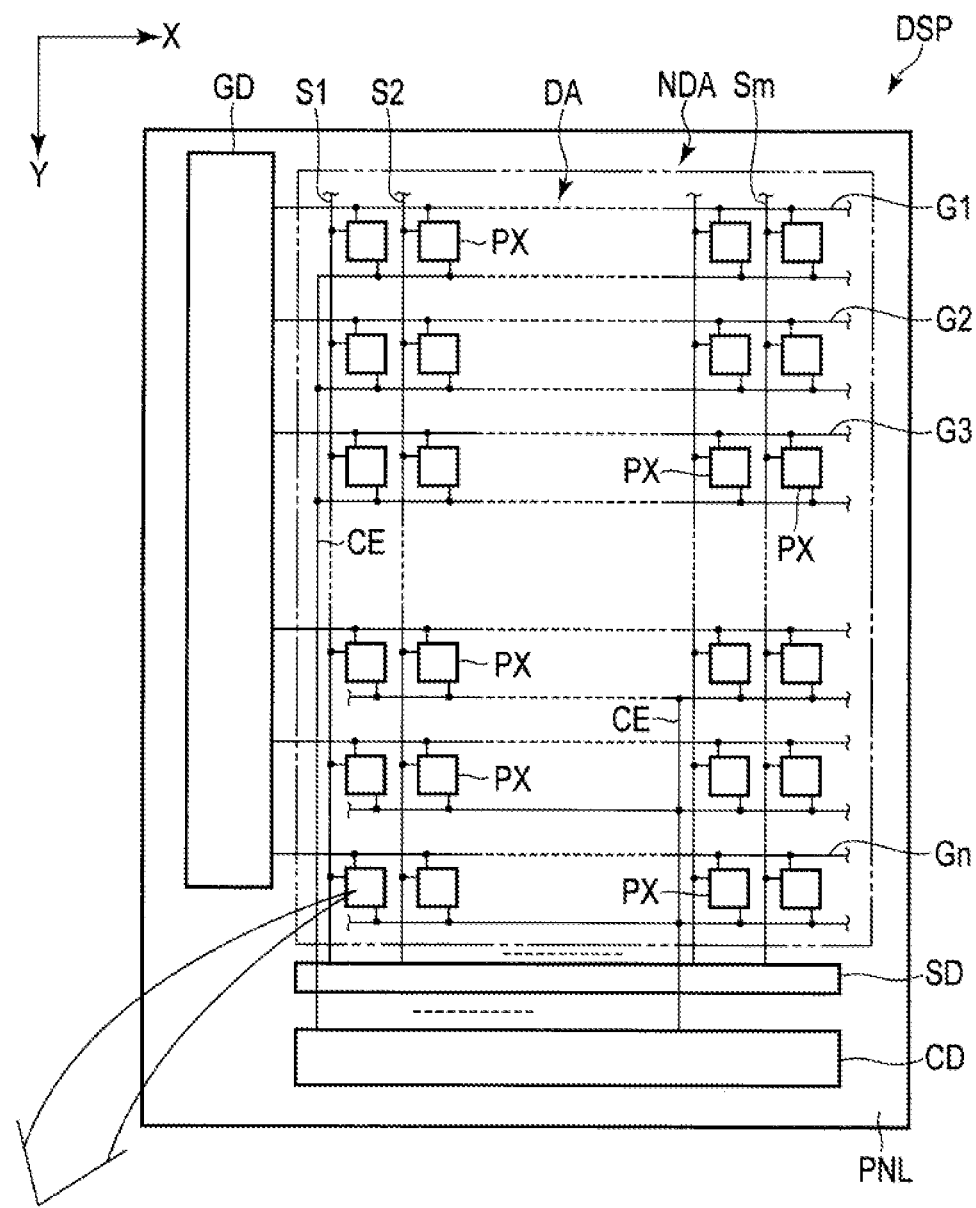
FIG. 3 is a diagram showing a basic configuration and an equivalent circuit, of the display panel shown in FIG. 1.
Figure 3:
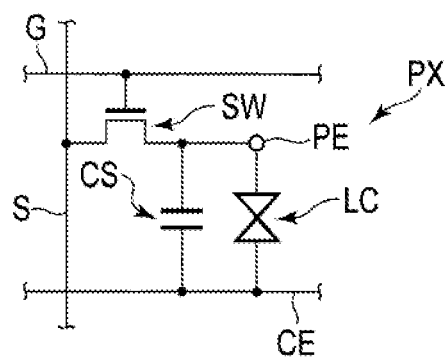

FIG. 3 is a diagram showing a basic configuration and an equivalent circuit, of the display panel PNL shown in FIG. 1, and illustration of a round portion R shown in FIG. 1 is omitted. The display panel PNL comprises pixels PX in the display area DA. The pixels PX are arrayed in a matrix. In addition, the display panel PNL comprises scanning lines G (G1 to Gn), signal lines S (S1 to Sm), a common electrode CE and the like, in the display area DA. The scanning lines G extend in the first direction X so as to be spaced apart and arranged in the second direction Y. The signal lines S extend in the second direction Y so as to be spaced apart and arranged in the first direction X. The scanning lines G and the signal lines S may not extend linearly, but may be partially bent. The partially bent scanning lines G and signal lines S are assumed to extend in the first direction X and the second direction Y. The common electrodes CE are disposed across the pixels PX.

The scanning lines G are connected to the scanning line drive circuit GD. The signal lines S are connected to the signal line drive circuit SD. The common electrodes CE are connected to the common electrode drive circuit CD. The signal line drive circuit SD, the scanning line drive circuit SD, and the common electrode drive circuit CD may be disposed on the first substrate SUB1 in the non-display area NDA or several parts or all parts of them may be built in the IC chip CP shown in FIG. 2. For example, the scanning line drive circuits GD are disposed between the longer sides LS1 and LS11, and between the longer sides LS2 and LS12 as represented by dotted lines in FIG. 1. However, the layout of the drive circuits is not limited to the example illustrated.

Each pixel PX comprises a switching element SW, a pixel electrode PE, the common electrode CE, a liquid crystal layer LC and the like. The switching element SW is composed of, for example, a thin-film transistor (TFT) and is electrically connected to the scanning line G and the signal line S. The scanning line G is connected to the switching element SW in each of the pixels PX arranged in the first direction X. The signal line S is connected to the switching element SW in each of the pixels PX arranged in the second direction Y. The pixel electrode PE is electrically connected to the switching element SW. Each of the pixel electrodes PE is opposed to the common electrode CE and drives the liquid crystal layer LC with an electric field generated between the pixel electrode PE and the common electrode CE. A storage capacitor CS is formed, for example, between an electrode having the same potential as an electric potential of the common electrode CE and an electrode having the same potential as an electric potential of the pixel electrode PE.

Detailed explanations of a configuration of the display panel PNL are omitted but, the pixel electrode PE is disposed on the first substrate SUB1 while the common electrode CE is disposed on the second substrate SUB2, in the display mode using the longitudinal electric field along the normal of the main surface of substrate or the display mode using the inclined electric field which is obliquely inclined to the normal of the main surface of substrate. In addition, both of the pixel electrode PE and the common electrode CE are disposed on the first substrate SUB1, in the display mode using the lateral electric field along the main surface of the substrate. Furthermore, the display panel PNL may be configured to correspond to a display mode using an arbitrary combination of the longitudinal, lateral, and inclined electric fields. The main surface of the substrate corresponds to an X-Y plane defined by the first direction X and the second direction Y.

Figure 4:
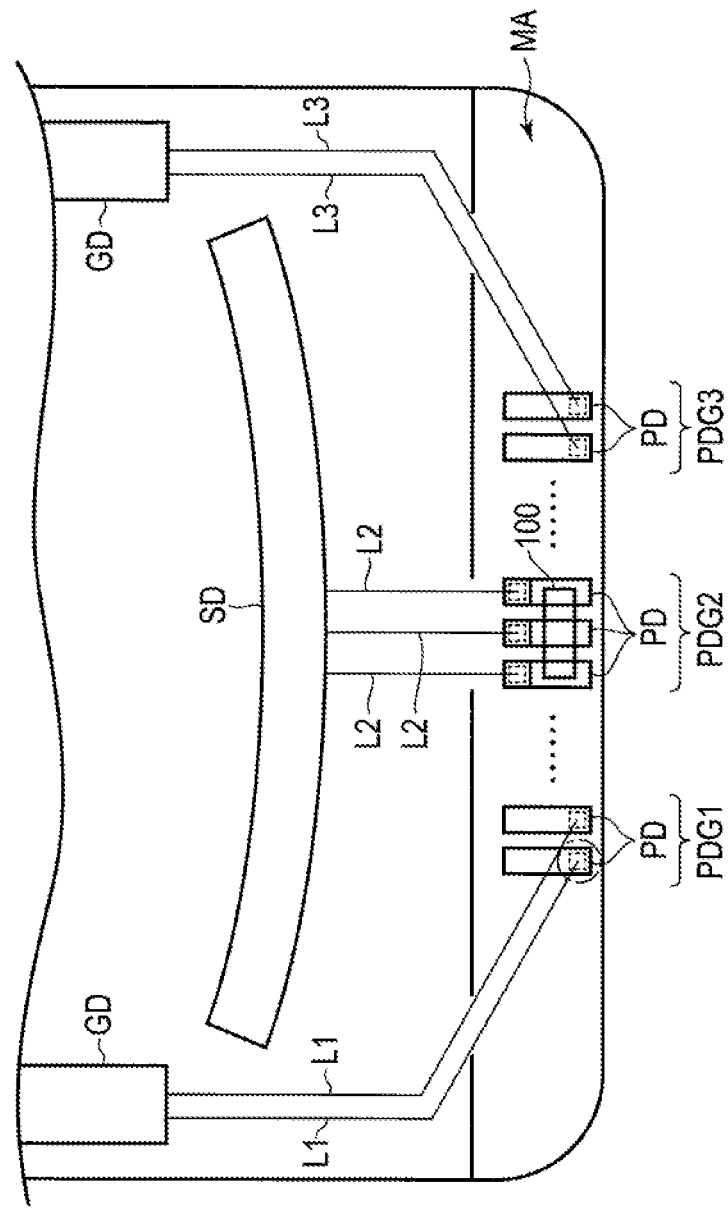
FIG. 4 is an enlarged view showing a vicinity of a mounting area.

FIG. 4 is an enlarged view showing a vicinity of the mounting area MA.

A number of pads (terminals) PD are formed in the mounting area MA to supply signals and voltages from the flexible printed circuit F to the scanning line drive circuits GD and the signal line drive circuit SD. The pads FD are formed to be arranged in the first direction X, and a predetermined gap is formed between a pad PD and the other pad PD adjacent to the pad PD. A first pad group PDG1 located on the left side of the figure, of the pads PD, is connected to one of the scanning line drive circuits GD by leads L1. Similarly, a second pad group PDG2 located in the center of the figure, of the pads PD, is connected to the signal line drive circuit SD by leads L2. A third pad group PDG3 located on the right side of the figure, of the pads PD, is connected to the scanning line drive circuits GD by leads L3 different from the scanning line drive circuit GD connected to the first pad group PDG1.

The leads L1 are drawn from a glass end side of the pads PD included in the first pad group PDG1. Similarly, the leads L3 are drawn from a glass end side of the pads PD included in the third pad group PDG3. In contrast, the leads L2 are drawn from a side opposite to a glass end side of the pads PD included in the second pad group PDG2.

The leads L1 other than the lead L1 drawn from the pad PD located on the outermost side of the left side in the figure overlaps the other pad PD adjacent to (located) in the drawing direction (leftward direction in the figure) as seen from the pad PD from which the lead itself is drawn. The lead L1 drawn from the pad PD located on the outermost side of the left side in the figure does not overlap the other pad PD. Similarly, the leads L3 other than the lead L3 drawn from the pad PD located on the outermost side of the right side in the figure overlaps the other pad PD adjacent to (located) in the drawing direction (rightward direction in the figure) as seen from the pad PD from which the lead itself is drawn. The lead L3 drawn from the pad PD located on the outermost side of the right side in the figure does not overlap the other pad PD. In contrast, the leads L2 do not overlap the pads PD other than the pads PD from which the leads themselves are drawn.

In FIG. 4, the leads L1 are drawn from the first pad group PDG1 to be parallel to each other, and the leads L1 are not limited to this example but may not be drawn parallel to each other. Similarly, the leads L3 may not be drawn parallel either.

Figure 5:
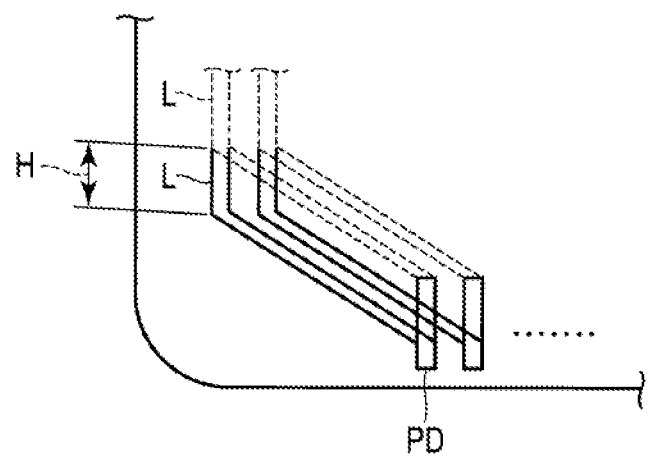
FIG. 5 is a view for explanation of a difference in drawing leads.

A difference between a general manner of drawing the leads connected to the scanning line drive circuit GD and a drawing manner in the embodiments will be explained with respect to FIG. 5. FIG. 5 is a view for explanation of a difference in drawing the leads.

In general, the leads L connected to the scanning line drive circuit GD are drawn from upper ends of the pads as represented by dotted lines in FIG. 5. At this time, the leads L need to be drawn with an inclination of a predetermined or more degree. This is because an inconvenience that the width of the leads L is smaller and the resistance is larger if the leads L are inclined at a predetermined or less degree, i.e., inclined so much smoothly is caused. For this reason, the leads L need to be drawn at a predetermined or more degree and, for this convenience, space having a predetermined length (height) in the second direction Y is required to draw the leads L toward the scanning line drive circuit GD. According to this, an inconvenience that the frame of the display panel PNL cannot be made smaller than a predetermined degree (in other words, the display area cannot be extended) is caused.

In contrast, the leads L of the embodiments are drawn from lower ends of the pads PD as represented by solid lines in FIG. 5. In other words, the height (space) in the second direction Y necessary to draw the leads L toward the scanning line drive circuit GD can be made from the lower ends of the pads PD. Thus, the display area DA can be extended by the degree of lowering the drawing positions of the leads L from the upper ends of the pads PD to the lower ends of the pads PD. More specifically, the display area DA can be extended by height H. According to this, narrowing the display panel PNL can be implemented.

The display panel PNL is drawn such that the panel ID 100 which is an individual identification number or individual identification mark of the display panel PNL overlaps the second pad group PDG2, though the details will be explained later.

Figure 6:
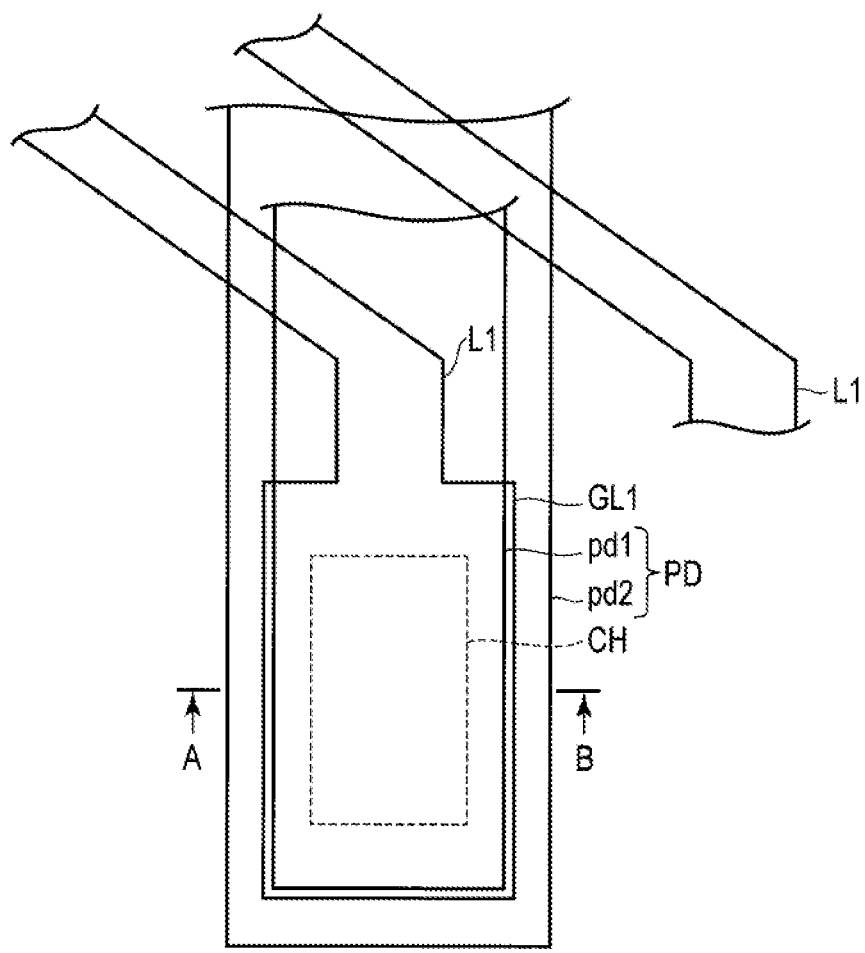
FIG. 6 is an enlarged view showing one of pads in a first pad group.
Figure 7:
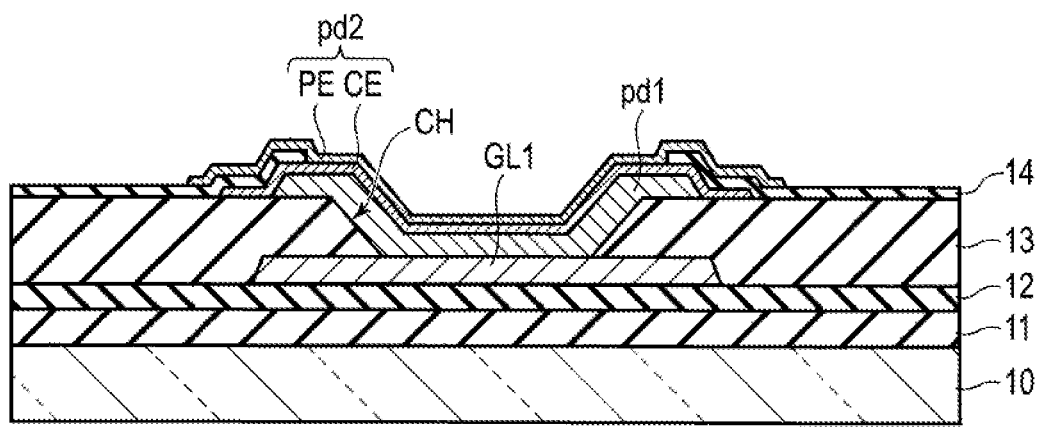
FIG. 7 is a cross-sectional view showing a structure of the pad shown in FIG. 6 cut along line A-B.

FIG. 6 is an enlarged view showing the pad PD including the area surrounded by the one-dot-chained line in FIG. 4, which relates to, for example, the first pad group PDG1. FIG. 7 is a cross-sectional view showing a structure of the pad shown in FIG. 6 cut along line A-B.

The pad PD is composed of a stacked layer body formed by stacking a first pad portion pd1 and a second pad portion pd2. The pad PD is formed above a first insulating substrate 10, a first insulating film 11, a second insulating film 12, a first metal layer GL1, and a third insulating film 13.

The insulating substrate 10 is formed of, for example, a transmissive glass substrate, a flexible resin substrate or the like. The above-mentioned glass end is a term indicating a substrate end of the first insulating substrate 10 in a case where, for example, the first insulating substrate 10 is a glass substrate, and may also be simply called a substrate end. In addition, if the first insulating substrate 10 is a resin substrate, its end portion may be called a resin end or may also be simply called a substrate end. The first insulating film 11 is located on the first insulating substrate 10. The first insulating film 11 may have a single-layer structure or a multilayer structure, and is formed of, for example, a silicon nitride film (SiN) and a silicon oxide film (SiO2). The second insulating film 12 is located on the first insulating film 11. The second insulating film 12 is formed of, for example, a silicon oxide film (SiO2 (TEOS)).

The first metal layer GL1 is located on the second insulating film 12. The first metal layer GL1 is formed integrally or sequentially with the lead L (lead L1 in this case) for supplying signals from the flexible printed circuit F. The first metal layer GL1 forms not only the lead L, but also, for example, the scanning line G of the pixel PX in the display area DA. The lead L and the scanning line G are located in the same metal layer and are formed of, for example, a light-shielding metal material such as molybdenum (Mo) or tungsten (W) or an alloy of a combination of these light-shielding metal materials, in the same manufacturing process.

The third insulating film 13 is formed to cover the first metal layer GL1, and a contact hole CH penetrating to the first metal layer GL1, i.e., the lead L is formed in the third insulating film 13. The third insulating film 13 is formed of, for example, a silicon nitride film (SiN) and a silicon oxide film (SiO2).

The first pad portion pd1 constituting the pad PD is formed in an insular shape on the third insulating film 13 and is in contact with the first metal layer GL1 formed integrally (sequentially) with the lead L1 in the contact hole CH. The first pad portion pd1 can also be represented as a second metal layer relative to the first metal layer indicating the lead L. An outer shape of the first pad portion pd1 is formed to be larger than the contact hole CH for contact with the first metal layer GL. The first pad portion pd1 is located in the same metal layer as, for example, the signal line S of the pixel PX in the display area DA, and is formed of, for example, a light-shielding metal material such as titanium nitride (TiN), molybdenum (Mo) or tungsten (W) or an alloy of a combination of these light-shielding metal materials. The first pad portion pd1 is electrically connected to the flexible printed circuit F.

A first transparent conductive film CE, a fourth insulating film 14, and a second transparent conductive film PE are stacked in this order on the third insulating film 13. A contact hole CH penetrating to the first pad portion pd1 is formed in the fourth insulating film 14 similarly to the contact hole formed in the third insulating film 13. The second pad portion pd2 composed of the first transparent conductive film CE and the second transparent conductive film PE is in contact with the first pad portion pd1 through the contact, hole CH. An outer shape of the second pad portion pd2 is formed to be larger than the contact hole CH for contact with the first pad portion pd1. The first transparent conductive film CE constituting the second pad portion pd2 is formed of, for example, the same material as the transparent conductive film forming the common electrode CE of the pixel PX in the display area DA, in the same manufacturing process. The second transparent conductive film PE is formed of, for example, the same material as the transparent conductive film forming the pixel electrode PE of the pixel PX in the display area DA, in the same manufacturing process. The first transparent conductive film may be formed in the same manufacturing process as the pixel electrode PE according to the layer structured of the pixel PX, and the second transparent film may be formed in the same manufacturing process as the common electrode CE. The first transparent conductive film CE and the second transparent conductive film PE are formed of, for example, a transparent conductive film such as indium-tin-oxide (ITO) or indium-zinc-oxide (IZO). The fourth insulating film 14 is formed of, for example, a silicon nitride film (SiN).

In FIG. 6 and FIG. 7, the pad PD is composed of the first pad portion pd1 serving as the second metal layer and the second pad portion pd2 including the first transparent conductive film CE and the second transparent conductive film PE, and the structure of the pad PD is not limited to this but may further comprise, for example, a third pad portion pd3 serving as a third metal layer formed of a metal layer. The configuration in this case is shown in FIG. 8 and FIG. 9.

FIG. 8 is an enlarged view showing one of the pads PD different from the pad shown in FIG. 6, which relates to, for example, the second pad group PDG2. FIG. 9 is a cross-sectional view showing a structure of the pad PD shown in FIG. 8 cut along line C-D. The structure shown in FIG. 8 and FIG. 9 is different from the structure shown in FIG. 6 and FIG. 7 with respect to a feature of further comprising a third pad portion pd3 serving as a third metal layer. In addition, since the pad PD shown in FIG. 8 relates to the second pad group PDG2, the structure is also different from the structure shown in FIG. 6 with respect to a feature that a panel ID 100 is disposed on the glass end side of the pad PD (i.e., a side opposite to the drawing direction of the lead L2). However, the panel ID 100 will be explained later in detail and its detailed explanations are omitted here.

The third pad portion pd3 is located on the first pad portion pd1 and is covered with the first transparent conductive film CE constituting the second pad portion pd2. In other words, the outer shape of the third pad portion pd3 is smaller than the larger than the first pad portion pd1 and smaller than the second pad portion pd2. The third pad portion pd3 is located in, for example, a metal layer formed in a layer different from the scanning line G (first metal layer GL) and the signal line S (second metal layer). The third pad portion pd3 is formed of, for example, a light-shielding metal material such as titanium nitride (TiN), titanium (Ti) or molybdenum (Mo) or an alloy of a combination of these light-shielding metal materials. Since the structure is similar to the structure shown in FIG. 6 and FIG. 7 except for a feature that the third pad portion pd3 is formed between the first pad portion pd1 and the second pad portion pd2, detailed explanations of the other constituent features are omitted here. Similarly, in the structure shown in FIG. 6 and FIG. 7, too, the third pad portion pd3 may be formed between the first pad portion pd1 and the second pad portion pd2.

In addition, in the display panel PNL of the embodiments, as shown in FIG. 10, an organic planarizing film HRC is formed in a region other than a pad formation region PDR where the pads PD are formed, of the mounting area MA of the first substrate SUB1. More specifically, the organic planarizing film HRC is formed in a region of the mounting area MA other than the pad formation region PDR, and this region extends to central portions of the sides in the second direction Y, of the sides of the pads PD. A fourth insulating film 14 is formed on the organic planarizing film HRC and, for example, the organic planarizing film HRC is sandwiched between the third insulating film 13 and the fourth insulating film 14. For example, the third metal layer of the third pad portion pd3 explained with reference to FIG. 8 and FIG. 9 is formed on the organic planarizing film HRC other than the pad formation region PDR. The third metal layer of the third pad portion pd3 may be formed as a lead connected to the lead L via the contact hole formed in the organic planarizing film HRC.

FIG. 11 is an enlarged view showing a vicinity of the panel ID 100 shown in FIG. 4, and FIG. 12 is a cross-sectional view showing a structure of the panel ID 100 shown in FIG. 11 cut along line E-F. A pattern of the panel ID 100 shown in FIG. 11 is a mere example and does not indicate that the semiconductor layer (i.e., a semiconductor layer SC to be explained later) exists at black pattern portions and does not exist at white pattern portions.

In the panel ID 100, the contact hole CH through which the first metal layer GL1 makes contact with the first pad portion pd1 is formed under the second pad group PDG2 formed at the upper ends (i.e., the side opposite to the glass end or opposite to substrate end) of the pads. In other words, the panel ID 100 is formed under the pad group where the lead L is drawn from the upper ends (i.e., the side opposite to the substrate end) of the pads PD.

The panel ID 100 is composed of a semiconductor layer SC located under the first metal layer GL. The panel ID 100 is an individual identification number or individual identification mark of the display panel PNL, which can be read from the TFT glass surface (back surface).

The semiconductor layer SC constituting the panel ID 100 is formed in an insular shape on the first insulating film 11, and is covered with the second insulating film 12. The semiconductor layer SC is formed of, for example, polycrystalline silicon (P—Si), amorphous silicon (a-Si), or the like. The panel ID 100 represents the individual identification number or individual identification mark of the display panel PNL in accordance with the pattern of the semiconductor layers SC constituting the panel ID 100.

A first metal layer GL2 is entirely formed separately from the first metal layer GL1, on the second insulating film 12, i.e., in the same layer as the first metal layer GL1 formed integrally (or sequentially) with the lead L2. An outer shape of the first metal layer GL2 is larger than the outer shape of the panel ID 100. The first metal layer GL2 is formed of, for example, the same metal material as the first metal layer GL1, and the above-explained metal material and the like can be employed.

The first, metal layer GL is entirely formed above the semiconductor layer SC constituting the panel ID 100 and its outer shape is larger than the outer shape of the panel ID 100. Thereby, the first metal layer GL2 functions as a background for reading the panel ID 100 from the TFT glass substrate.

The third insulating film 13 is formed on the first metal layer GL2, and the first pad portion pd1 is formed in an insular shape on the third insulating film 13. The first transparent conductive film CE, the fourth insulating film 14, and the second transparent conductive film PE are stacked in this order on the first pad portion pd1.

The following advantages can be obtained by forming the panel ID 100 under the second pad group PDG2.

First, a general arrangement of the panel ID 100 will be explained with reference to FIG. 13. FIG. 13 shows a general arrangement example of the panel ID 100. In this figure, AM represents an alignment mark, and the alignment mark AM is used for adjustment of position when the flexible printed circuit F is stuck.

The panel ID 100 is generally disposed in a dedicated space SP provided besides the pads PD. In other words, a dedicated space SP to arrange the panel ID 100 needs to be provided in the non-display area NDA. For this convenience, an inconvenience that the frame of the display panel PNL cannot be made smaller than a predetermined degree (in other words, the display area cannot be extended) is caused. In addition, recently, a demand for variation in shape of making the shape of the display panel PNL different from a square such as rounding corner portions of the display panel PNL has been increased, and the dedicated space SP to arrange the panel ID 100 may be an obstacle for variation in shape.

In contrast, in the display panel PNL of the embodiments, since the panel ID 100 is disposed under the second pad group PDG2 and a dedicated space SP to arrange the panel ID 100 does not need to be provided, the display area DA can be expanded by the dedicated space SP. In other words, narrowing the display panel PNL can be implemented.

In addition, since the panel ID 100 is disposed under the pads PD (in this case, under the second pad group PDG2) necessarily disposed to provide the flexible printed circuit F, the degree of freedom in the shape of the display panel PNL can be increased.

In the embodiments, as shown in FIG. 11 and FIG. 12, the first metal layer GL2 is entirely formed above the semiconductor layer SC constituting the panel ID 100 and is formed such that its outer shape is larger than the outer shape of the panel ID 100. Thereby, the first metal layer GL2 functions as the background for reading the panel ID 100. However, the background for reading the panel ID 100 may not be limited to the first metal layer GL2.

Figure 14:
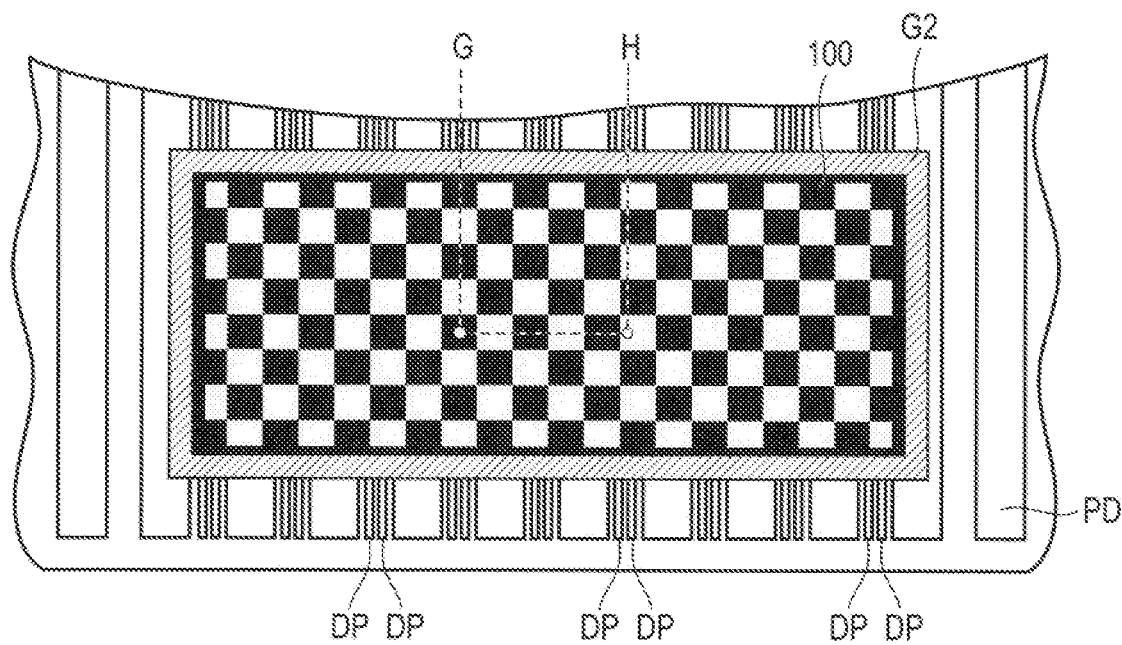
FIG. 14 is another enlarged view showing the vicinity of the panel ID.
Figure 15:
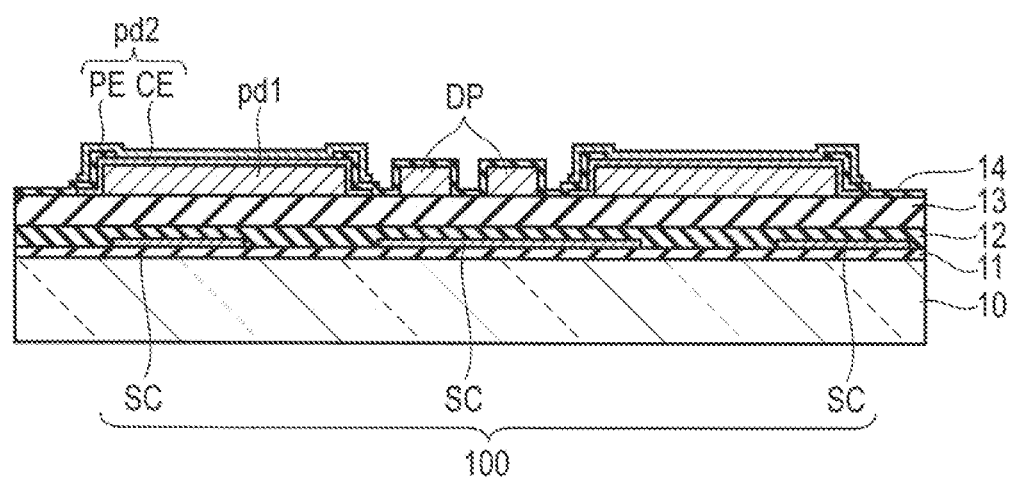
FIG. 15 is a cross-sectional view showing a structure of the panel ID shown in FIG. 14 cut along line G-H.

FIG. 14 is an enlarged view showing a vicinity of the panel ID 100 unlike FIG. 11, and FIG. 15 is a cross-sectional view showing a structure of the panel ID 100 shown in FIG. 14 cut along line G-H. The structure shown in FIG. 14 and FIG. 15 is different from the structure shown in FIG. 11 and FIG. 12 with respect to a feature that the first metal layer GL2 is not disposed and one or more dummy patterns DP are formed between the pads PD.

Similarly to FIG. 11, a pattern of the panel ID 100 shown in FIG. 14 is a mere example and does not indicate that the semiconductor layer SC exists at black pattern portions and does not exist at white pattern portions.

The semiconductor layer SC constituting the panel ID 100 is formed in an insular shape on the first insulating film 11, and is covered with the second insulating film 12, similarly to the structure shown in FIG. 11 and FIG. 12. The third insulating film 13 is located on the second insulating film 12. The first pad portions pd1 are formed in an insular shape on the third insulating film 13, and one or more dummy patterns DP are formed between the first pad portions pd1. In FIG. 14 and FIG. 15, two dummy patterns DP are formed but the number of dummy patterns DP may be one or more. As shown in FIG. 14 and FIG. 15, however, plural dummy patterns DP are desirably formed from the viewpoint of avoiding a risk of short.

The dummy patterns DP are formed of, for example, the same metal material as the first pad portion pd1, and the above-explained metal material and the like can be employed. In addition, the length (width) of the dummy patterns DP in the first direction X is larger than the width of the signal line S extending in the display area DA. Furthermore, the length between the first pad portion pd1 and the dummy pattern DP, and the length between two adjacent dummy patterns DP are sufficiently smaller than the minimum value (i.e., 1 dot) of the length (width) of the semiconductor layer SC in the first direction X.

The first transparent conductive film CE, the fourth insulating film 14, and the second transparent conductive film PE are stacked in this order on the first pad portion pd1, and the dummy patterns DP are also covered with the fourth insulating film 14.

As shown in FIG. 14 and FIG. 15, one or more slits between the pads PD are sufficiently smaller than the minimum value of the width of the semiconductor layer SC constituting the panel ID 100 and the pattern density becomes constant (in other words, the rate of slits can be reduced) by forming one or more dummy patterns DP between the pads PD. Thereby, instead of the first metal layer GL2 shown in FIG. 11 and FIG. 12, the pads PD and the dummy patterns DP can be made to function as the background for reading the panel ID 100.

In the embodiments, the panel ID 100 is composed of the semiconductor layer SC but is not limited to this, and the panel ID 100 may be composed of the lower light-shielding layer US disposed under the semiconductor layer SC. The configuration in this case is shown in FIG. 16.

The lower light-shielding layer US is formed in an insular shape on the first insulating substrate 10 and is covered with the first, insulating film 11. The lower light-shielding layer US is formed of black resin, a light-shielding metal, or the like. As shown in FIG. 16, if the panel ID 100 is composed of the lower light-shielding layer US, the first metal layer GL2 may not be formed and the semiconductor SC may be entirely formed as the background.

Alternatively, if the panel ID 100 is composed of the lower light-shielding layer US, the semiconductor SC may not be formed and the first metal layer GL2 may be entirely formed as the background though not shown in the figure. Furthermore, not the semiconductor layer SC or the first metal layer GL2, but dummy patterns DP may be formed between the pads PD, and the pads PD and the dummy patterns DP may function as the background.

In the embodiments, the leads L, the first metal layer GL1 formed integrally (sequentially) with the leads L, and the panel ID 100 are generically called patterns similarly to the lead pattern and the identification mark pattern and are formed under the pads PD. However, the patterns formed under the pads PD are not limited to this example and, for example, alignment marks for adjustment of position, bar codes, numbers, alphabets, and the like may be formed under the pads PD.

As explained above, if the first metal layer GL1, the leads L, and the panel ID 100 are generically called first patterns, the first metal layer GL2 and the dummy patterns DP functioning as the background of the panel ID 100 may be called second patterns.

According to the embodiments, as explained above, the display device capable of narrowing the frame can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a scanning line extending in a first direction in a display area;
   a first terminal disposed in a non-display area;
   a second terminal disposed in the non-display area and adjacent to the first terminal in the first direction;
   a first lead drawn from the first terminal; and
   a second lead drawn from the second terminal, wherein
   the first direction intersects a second direction,
   the first direction and the second direction are orthogonal to a third direction,
   the second lead overlaps the first terminal in the third direction,
   the second terminal is formed of a first metal layer,
   the second lead is formed of a second metal layer different from the first metal layer,
   the second terminal and the second lead are connected to each other at a first end portion of the second terminal, and
   the first end portion is located on a side opposite to the display area, in the second direction.

2. The display device of claim 1, wherein
   the first lead does not overlap the second terminal in the third direction.

3. A display device comprising:
   signal lines arrayed in a first direction in a display area;
   scanning lines arrayed in a second direction intersecting the first direction in the display area;
   a first terminal disposed in a non-display area outside of the display area;
   a second terminal disposed in the non-display area and adjacent to the first terminal in the first direction;
   a first lead drawn from the first terminal; and
   a second lead drawn from the second terminal, wherein
   the second lead overlaps the first terminal in a plan view, and
   the second lead traverses the first terminal in a plan view.

4. The display device of claim 3, wherein
   the second terminal is formed of a first metal layer,
   the second lead is formed of a second metal layer different from the first metal layer,
   the second terminal and the second lead are connected to each other at a first end portion of the second terminal, and
   the first end portion is located on a side opposite to the display area, in the second direction.

5. The display device of claim 1, wherein
   the first terminal is formed of the first metal layer,
   the first lead is formed of the second metal layer different from the first metal layer,
   the first terminal and the first lead are connected to each other at a first end portion of the first terminal,
   the first terminal has a second end portion,
   the second end portion of the first terminal is opposed to the first end portion of the first terminal in the second direction,
   the first end portion of the first terminal is located on a side opposite to the display area, in the second direction, and
   the second lead traverses the first terminal between the first end portion of the first terminal and the second end portion of the first terminal.

6. The display device of claim 5, wherein
   the second lead traverses the first terminal diagonally with respect to the first direction and the second direction.

7. The display device of claim 5, further comprising an insulating film, wherein
   the insulating film is between the first terminal and the second lead in the third direction,
   the first lead is connected to the first terminal via a contact hole at the first end portion of the first terminal, and
   the contact hole is formed in the insulating film.

8. The display device of claim 7, further comprising signal lines arrayed in the first direction in the display area, wherein
   the signal lines are formed of the first metal layer, and
   the scanning line is formed of the second metal layer.

9. The display device of claim 1, further comprising a flexible printed circuit,
   wherein the flexible printed circuit is connected to the first terminal and the second terminal.

10. The display device of claim 4, wherein
    the first terminal is firmed of the first metal layer,
    the first lead is formed of the second metal layer different from the first metal layer,
    the first terminal and the first lead are connected to each other at a first end portion of the first terminal,
    the first terminal has a second end portion,
    the second end portion of the first terminal is opposed to the first end portion of the first terminal in the second direction,
    the first end portion of the first terminal is located on a side opposite to the display area, in the second direction, and the second lead traverses the first terminal between the first end portion of the first terminal and the second end portion of the first terminal.

11. The display device of claim 10, wherein the second lead traverses the first terminal diagonally with respect to the first direction and the second direction.

12. The display device of claim 10, further comprising an insulating film, wherein
the insulating film is between the first terminal and the second lead in cross-sectional view,
the first lead is connected to the first terminal via a contact hole at the first end portion of the first terminal, and
the contact hole is formed in the insulating film.

13. The display device of claim 12, wherein
the signal lines are formed of the first metal layer, and
the scanning line is formed of the second metal layer.

14. The display device of claim 4, further comprising a flexible printed circuit,
wherein the flexible printed circuit is connected to the first terminal and the second terminal.

* * * * *